United States Patent
Yasuda

(10) Patent No.: US 7,598,761 B2
(45) Date of Patent: Oct. 6, 2009

(54) SEMICONDUCTOR INTEGRATED CIRCUIT HAVING A DEGRADATION NOTICE SIGNAL GENERATION CIRCUIT

(75) Inventor: Shinichi Yasuda, Yokohama-Shi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 11/896,851

(22) Filed: Sep. 6, 2007

(65) Prior Publication Data
US 2008/0218198 A1  Sep. 11, 2008

(30) Foreign Application Priority Data
Sep. 7, 2006 (JP) .............................. 2006-243290

(51) Int. Cl.
*G01R 31/02* (2006.01)
(52) U.S. Cl. .................................. 324/763; 324/158.1
(58) Field of Classification Search ...................... None
See application file for complete search history.

(56) References Cited

U.S. PATENT DOCUMENTS

| | | | |
|---|---|---|---|
| 4,853,628 A * | 8/1989 | Gouldsberry et al. ....... | 324/763 |
| 5,742,177 A * | 4/1998 | Kalb, Jr. .................... | 324/765 |
| 5,870,623 A * | 2/1999 | Shirata ....................... | 712/28 |
| 6,145,107 A * | 11/2000 | Farokhzad ................ | 714/745 |
| 6,550,038 B2 * | 4/2003 | Shirata ..................... | 716/4 |
| 7,102,358 B2 * | 9/2006 | Keshavarzi et al. ........ | 324/522 |
| 7,116,110 B1 * | 10/2006 | Li .............................. | 324/522 |
| 2008/0035921 A1 * | 2/2008 | Gonzalez et al. ........... | 257/48 |
| 2009/0082978 A1 * | 3/2009 | Yang et al. .................... | 702/58 |

FOREIGN PATENT DOCUMENTS

| | | |
|---|---|---|
| JP | 62-145173 | 6/1987 |
| JP | 9-197021 | 7/1997 |
| JP | 10-78920 | 3/1998 |
| JP | 10-133900 | 5/1998 |
| JP | 2003-177935 | 6/2003 |
| JP | 2006-60690 | 3/2006 |
| JP | 2008066536 A * | 3/2008 |

OTHER PUBLICATIONS

Dehon, "Array-Based Architecture for FET-Based, Nanoscale Electronics," IEEE Transactions on Nanotechnology (Mar. 2003), 2:23-32 (10 pages).
Notification of Reasons for Rejection issued by the Japanese Patent Office on Feb. 24, 2009, for Japanese Patent Application No. 2006-243290, and English-language translation thereof.
Notification of Reasons for Rejection issued by the Japanese Patent Office on Oct. 31, 2008, for Japanese Patent Application No. 2006-243290, and English-language translation thereof.

* cited by examiner

*Primary Examiner*—Paresh Patel
(74) *Attorney, Agent, or Firm*—Finnegan, Henderson, Farabow, Garrett & Dunner, L.L.P.

(57) ABSTRACT

It is made possible to detect degradation in a circuit before an operation fault will occur. A semiconductor integrated circuit includes: a circuit to be tested; a plurality of logical circuits which have different logical thresholds and which perform operation on an output of the circuit to be tested, on the basis of the logical thresholds; and a degradation notice signal generation circuit which generates a degradation notice signal to give notice that the circuit to be tested has degraded, when outputs of the logical circuits do not coincide with each other.

20 Claims, 16 Drawing Sheets

OR-INVERTER CONFIGURATION

AND-INVERTER CONFIGURATION

SEMICONDUCTOR INTEGRATED CIRCUIT HAVING A DEGRADATION NOTICE SIGNAL GENERATION CIRCUIT

CROSS-REFERENCE TO RELATED APPLICATION

This application is based upon and claims the benefit of priority from prior Japanese Patent Application No. 2006-243290 filed on Sep. 7, 2006 in Japan, the entire contents of which are incorporated herein by reference.

BACKGROUND OF THE INVENTION

1. Field of the Invention

The present invention relates to a semiconductor integrated circuit.

2. Related Art

As the technology node of LSI advances and the switching speed is improved, defects caused by circuit operation, such as degradation of the contact caused between wiring and semiconductors and breaking of wiring, are of concern.

Diode transistor logic type circuits are also begun to be proposed as circuit architecture of the next generation (see, for example, A. DeHon, IEEE TRANSACTIONS ON NANOTECHNOLOGY, VOL. 2, NO. 1, P. 23, MARCH 2003). In that case as well, it is of concern that degradation in diodes or resistors might cause a fault in circuit operation.

As a method for providing resistance against errors in circuit signals, a method of preparing some same circuits to provide redundancy and detecting and correcting an operation fault by comparing outputs of the circuits is widely used (see, for example, JP-A 2003-177935 (KOKAI)).

In this method, however, only a result of occurrence of an operation fault is detected, but it is impossible to inspect a state in which a circuit is being degraded. As for the cause of the operation fault, it cannot be discriminated whether it is an error caused occasionally by noise or whether it is an operation fault caused by device degradation. If the operation fault is caused by device degradation, it cannot be detected that delays in the circuit increase and timing margin is lost. As a result, it cannot be judged whether replacement of the circuit itself is needed or whether reconstruction of the circuit is necessary in a programmable circuit such as an FPGA (Field Programming Gate Array).

SUMMARY OF THE INVENTION

The present invention has been made in view of these circumstances, and an object thereof is to provide a semiconductor integrated circuit capable of detecting degradation in a circuit before an operation fault will occur.

A semiconductor integrated circuit according to a first aspect of the present invention includes: a circuit to be tested; a plurality of logical circuits which have different logical thresholds and which perform operation on an output of the circuit to be tested, on the basis of the logical thresholds; and a degradation notice signal generation circuit which generates a degradation notice signal to give notice that the circuit to be tested has degraded, when outputs of the logical circuits do not coincide with each other.

A semiconductor integrated circuit according to a second aspect of the present invention includes: a plurality of circuits to be tested which are same in configuration; a plurality of logical voltage variable circuits which are provided so as to be respectively associated with the circuits to be tested, each of which has a variable logical voltage threshold and performs operation on an output of the associated circuit to be tested, on the basis of the logical voltage threshold; and a plurality of degradation notice signal generation circuits which are provided so as to be respectively associated with the logical voltage variable circuits, and each of which generates a degradation notice signal to give notice that the associated circuit to be tested has degraded, provided that the output of the associated logical voltage variable circuit differs when the logical voltage threshold of the associated logical voltage variable circuit is changed.

A semiconductor integrated circuit according to a third aspect of the present invention includes: a circuit to be tested having first and second partial circuits; a test line; a first switch provided between an output of the first partial circuit and the test line; a second switch provided between an output of the second partial circuit and the test line; a plurality of logical inversion circuits which are connected to the test line, which have different logical inversion thresholds, and each of which inverts an output of at least one of the first and second partial circuits sent via the test line according to states of the first and second switches, on the basis of the logical inversion threshold; and a degradation notice signal generation circuit which generates a degradation notice signal to give notice that the circuit to be tested has degraded, when outputs of the logical inversion circuits do not coincide.

DETAILED DESCRIPTION OF THE INVENTION

Hereafter, embodiments of the present invention will be described with reference to the drawings.

FIRST EMBODIMENT

Figure 1:
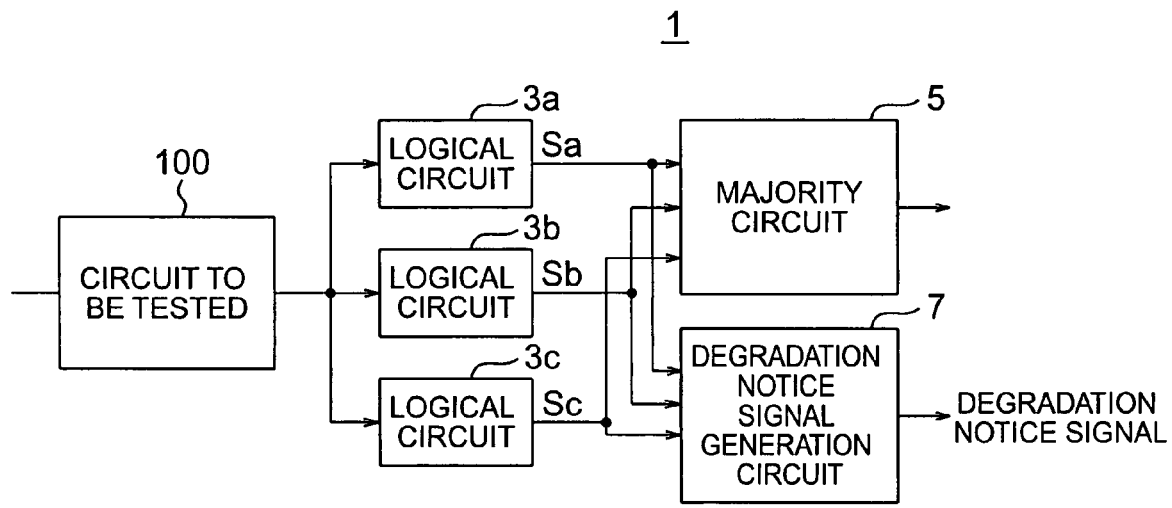
FIG. 1 is a block diagram showing a semiconductor integrated circuit according to a first embodiment of the present invention.

A semiconductor integrated circuit according to a first embodiment of the present invention is shown in FIG. 1. The semiconductor integrated circuit according to the present embodiment includes a circuit 100 to be tested as to whether degradation is present, and a test circuit 1 which tests whether the circuit 100 has degraded. The circuit 100 and the test circuit 1 are formed on the same chip.

Figure 2:
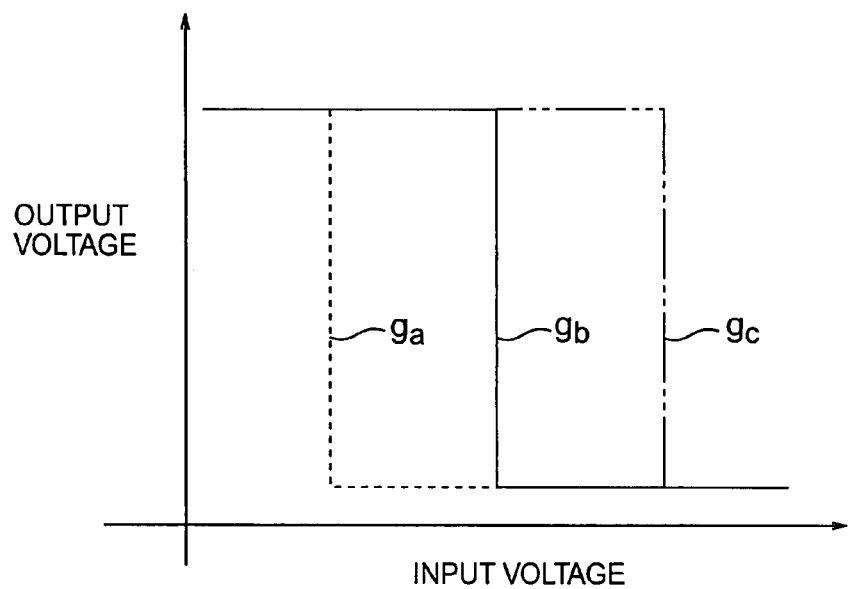
FIG. 2 is a graph showing input-output characteristics of a logic circuit according to the first embodiment.

The test circuit 1 includes a plurality of logic circuits 3a, 3b and 3c which conduct operation on output voltages of the circuit 100, a majority circuit 5 which selects and outputs a value of a level which occupies a majority among "H" levels or "L" levels of outputs Sa, Sb and Sc respectively of the logic circuits 3a, 3b and 3c, and a degradation notice signal generation circuit 7 which generates a degradation notice signal if the circuit 100 has degraded on the basis of the outputs of the logic circuits 3a, 3b and 3c. The logic circuits 3a, 3b and 3c have logical thresholds which are different from each other. In other words, it is meant that if the logic circuits 3a, 3b and 3c are inverters the logic circuits 3a, 3b and 3c have different input-output characteristics $g_a$, $g_b$ and $g_c$ as shown in FIG. 2. In FIG. 2, the input-output characteristic $g_a$ of the logic circuit 3a is inverted at a first lowest input voltage, the input-output characteristic $g_b$ of the logic circuit 3b is inverted at a second lowest input voltage, and the input-output characteristic $g_c$ of the logic circuit 3c is inverted at a third lowest input voltage. Since the logic circuits 3a, 3b and 3c need only have different logical thresholds (thresholds of logical voltages), not only the inverters but also flip-flops, buffers or other arbitrary logical circuits can be used as the logical circuits.

The reason why degradation of the circuit 100 is detected by the present embodiment will now be described. If degradation occurs in a contact or wiring in the circuit 100, resistance of that portion increases. If so, the output voltage of the circuit 100 does not swing fully between $V_{DD}$ (a voltage of a higher side) and $V_{SS}$ (a voltage of a lower side), but voltages between them are output.

Figure 3:
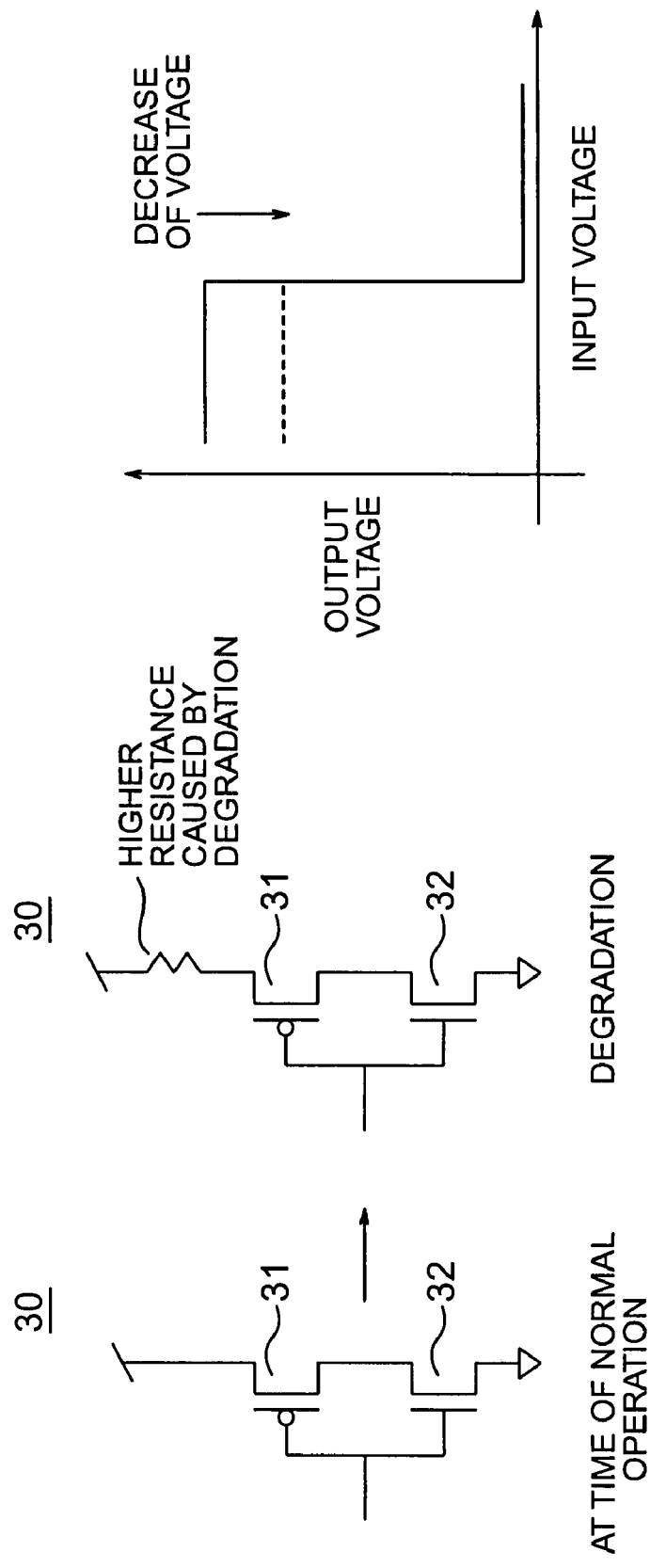
FIGS. 3A to 3C are diagrams for explaining a specific example in the case where a circuit to be tested has degraded and output characteristics obtained when the circuit has degraded, according to the first embodiment.

The present embodiment will be described by taking the case where an inverter 30 including a p-type MOS transistor (hereafter referred to as PMOS as well) 31 and an n-type MOS transistor (hereafter referred to as NMOS as well) 32 is used as the circuit 100 to be tested as shown in FIG. 3A, as an example. It is supposed that degradation has occurred between the PMOS 31 and a high power supply voltage as shown in FIG. 3B. When the PMOS 31 has turned on, therefore, the output voltage depends upon the ratio between resistance caused by the degradation and resistance of the NMOS 32. As a result, the "H" level of the output voltage of the circuit 100 falls slightly from $V_{DD}$ (FIG. 3C). The same is true of when degradation has occurred between the PMOS 31 and an output terminal, or when degradation has occurred in the PMOS 31. On the contrary, if degradation has occurred between the NMOS 32 and a low power supply voltage, between the NMOS 32 and the output terminal, or in the NMOS 32, the output voltage of the "L" level of the circuit 100 slightly rises from $V_{SS}$.

If degradation has occurred in the gate of the PMOS 31 or NMOS 32, it does not contribute directly to the output node. However, a delay time required for the gate voltage to arrive at a predetermined voltage is increased by an increase of resistance, and a state in which the PMOS 31 or NMOS 32 does not turn on completely at clock timing is caused. In this case as well, the output voltage changes. Furthermore, if the output voltage becomes less than $V_{DD}$ or $V_{SS}$, a sufficient voltage is not applied to a transistor in a subsequent circuit at its gate, and consequently an output voltage of the subsequent circuit also changes.

In the present embodiment, the test circuit 1 detects a voltage change of the circuit 100. In other words, the logic circuits 3a, 3b and 3c, which are different in logical voltage threshold, detect signals which indicate that the output voltage of the circuit 100 has fallen from $V_{DD}$ or risen from $V_{SS}$. If the voltage which has risen is input as a value between the threshold of the input-output characteristic $g_c$ and the threshold of the input-output characteristic $g_b$ shown in FIG. 2 or the voltage which has fallen is input as a value between the threshold of the input-output characteristic $g_a$ and the threshold of the input-output characteristic $g_b$ shown in FIG. 2, only one of the three logical circuits 3a, 3b and 3c outputs a different value. In such a state the degradation notice signal generation circuit 7 regards the circuit 100 as degraded, generates a degradation notice signal, and outputs it to the outside. In this way, it can be detected that the circuit 100 has degraded. Even in the above-described state, the majority circuit 5 selects a value of a level which gains a majority in "H" levels or "L" levels of the outputs Sa, Sb and Sc respectively of the logical circuits 3a, 3b and 3c, and sends the value of the level to the next circuit.

Figure 4:
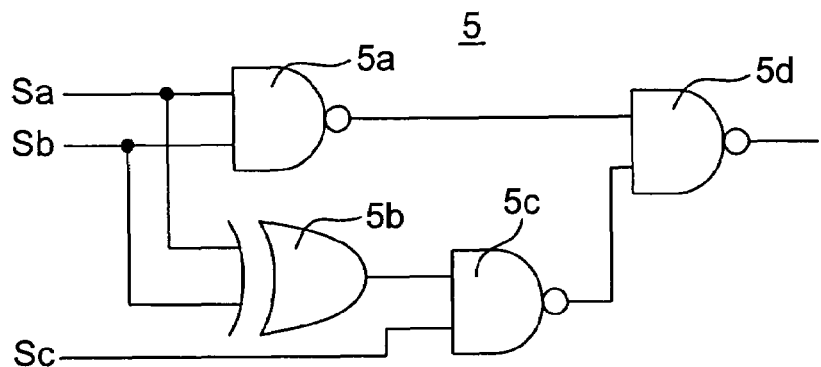
FIG. 4 is a circuit diagram showing a specific example of a majority circuit according to the first embodiment.

A specific example of the majority circuit 5 according to the present embodiment is shown in FIG. 4. The majority circuit 5 in this specific example includes a NAND circuit 5a which receives the output Sa of the logical circuit 3a and the output Sb of the logical circuit 3b, an exclusive-OR circuit 5b which receives the output Sa of the logical circuit 3a and the output Sb of the logical circuit 3b, a NAND circuit 5c which receives the output Sc of the logical circuit 3c and an output of the exclusive-OR circuit 5b, and a NAND circuit 5d which receives outputs of the NAND circuits 5a and 5c. The circuit shown in FIG. 4 is equivalent to a carry output of a full adder. In this case, the outputs Sa, Sb and Sc may be disposed on any terminals. As a matter of course, a circuit having a similar function can be implemented in a different configuration as well.

Figure 5:
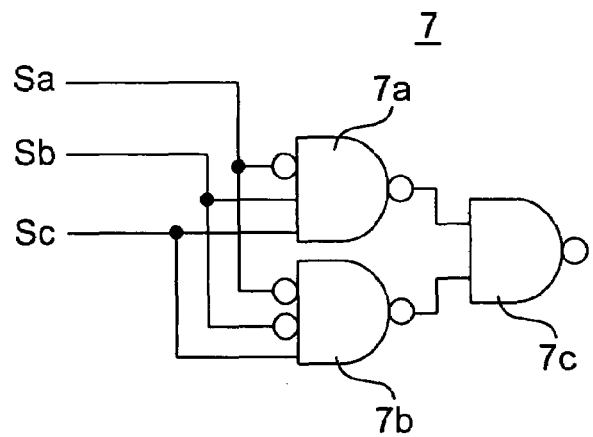
FIG. 5 is a circuit diagram showing a specific example of a degradation notice signal generation circuit according to the first embodiment.

A specific example of the degradation notice signal generation circuit 7 is shown in FIG. 5. The degradation notice signal generation circuit 7 includes three-input NAND circuits 7a and 7b and a two-input NAND circuit 7c. The NAND circuit 7a performs NAND operation on the basis of an inverted value of the output Sa of the logical circuit 3a, the output Sb of the logical circuit 3b, and the output Sc of the logical circuit 3c. The NAND circuit 7b performs NAND operation on the basis of an inverted value of the output Sa of the logical circuit 3a, an inverted value of the output Sb of the logical circuit 3b, and the output Sc of the logical circuit 3c. The NAND circuit 7c performs NAND operation on the basis of outputs of the NAND circuit 7a and the NAND circuit 7b. The degradation notice signal is output from such a configuration when the output voltage of the circuit 100 has fallen between the threshold of the logical circuit 3a and the threshold of the logical circuit 3b or between the threshold of the logical circuit 3b and the threshold of the logical circuit 3c. In this case, it is supposed that Sa, Sb and Sc respectively corresponding to $g_a$, $g_b$ and $g_c$ shown in FIG. 2 are disposed on circuit terminals as shown in FIG. 5. In FIG. 5, both signals are combined to form the degradation notice signal. Alternatively, it is also possible to output the outputs of the NAND circuits 7a and 7b to the outside without providing the NAND circuit 7c and check how degradation is caused.

Figure 6:
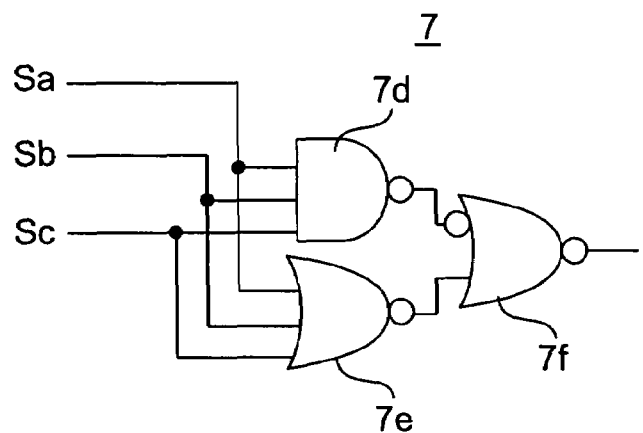
FIG. 6 is a circuit diagram showing another specific example of a degradation notice signal generation circuit according to the first embodiment.

As another specific example of the degradation notice signal generation circuit, the circuit may be formed as shown in FIG. 6. The degradation notice signal generation circuit 7 shown in FIG. 6 includes a three-input NAND circuit 7d, a three-input NOR circuit 7e, and a two-input NOR circuit 7f. The NAND circuit 7d performs NAND operation on the basis of the output Sa of the logical circuit 3a, the output Sb of the logical circuit 3b, and the output Sc of the logical circuit 3c. The NOR circuit 7e performs NOR operation on the basis of the output Sa of the logical circuit 3a, the output Sb of the logical circuit 3b, and the output Sc of the logical circuit 3c. The NOR circuit 7f performs NOR operation on the basis of an inverted value of an output of the NAND circuit 7d and an output of the NOR circuit 7e. The degradation notice signal generation circuit 7 outputs the degradation notice signal when the three outputs do not coincide with each other. As compared with the case shown in FIG. 5, therefore, it cannot be decided how degradation occurs in the circuit 100, but a defect to wiring for propagating a signal can be detected.

A method for changing the threshold of the logical voltage will now be described.

Figure 7:
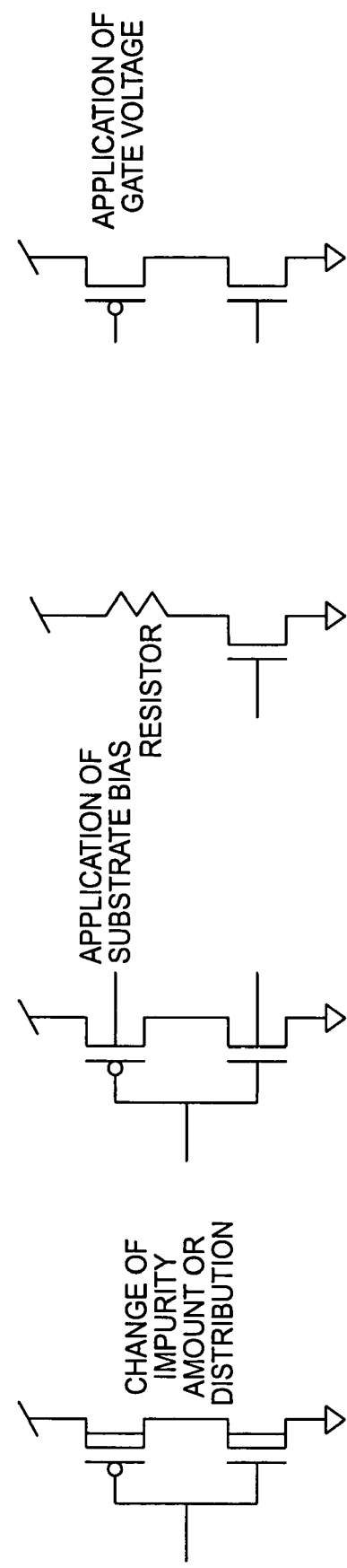
FIGS. 7A to 7D are diagrams showing examples of a change of a logical threshold.

Although there are several methods for changing the threshold of the logical voltage, it can be implemented by changing a threshold of a transistor or load resistance of an inverter. The threshold can be changed by changing the quantity of impurities in a channel or around the channel of a transistor included in an inverter or changing distribution of impurities as shown in FIG. 7A or applying a substrate bias to a transistor included in an inverter as shown in FIG. 7B. As for a method for changing the load resistance, there is a method for actually changing the value of the resistance as shown in FIG. 7C or a method of changing a gate voltage of a transistor for load resistance as shown in FIG. 7D. In FIG. 7D, a transistor located nearer the high power supply voltage is used as the load and the input is supplied to the gate of the NMOS transistor. As a matter of course, however, it is also possible to use a transistor located near the low high power supply voltage as the load and the input is supplied to the gate of the PMOS transistor. In the method using the substrate bias and the method of changing the gate bias of the transistor, it is also possible to change the threshold of the logical voltage dynamically by using an external signal.

Figure 8:
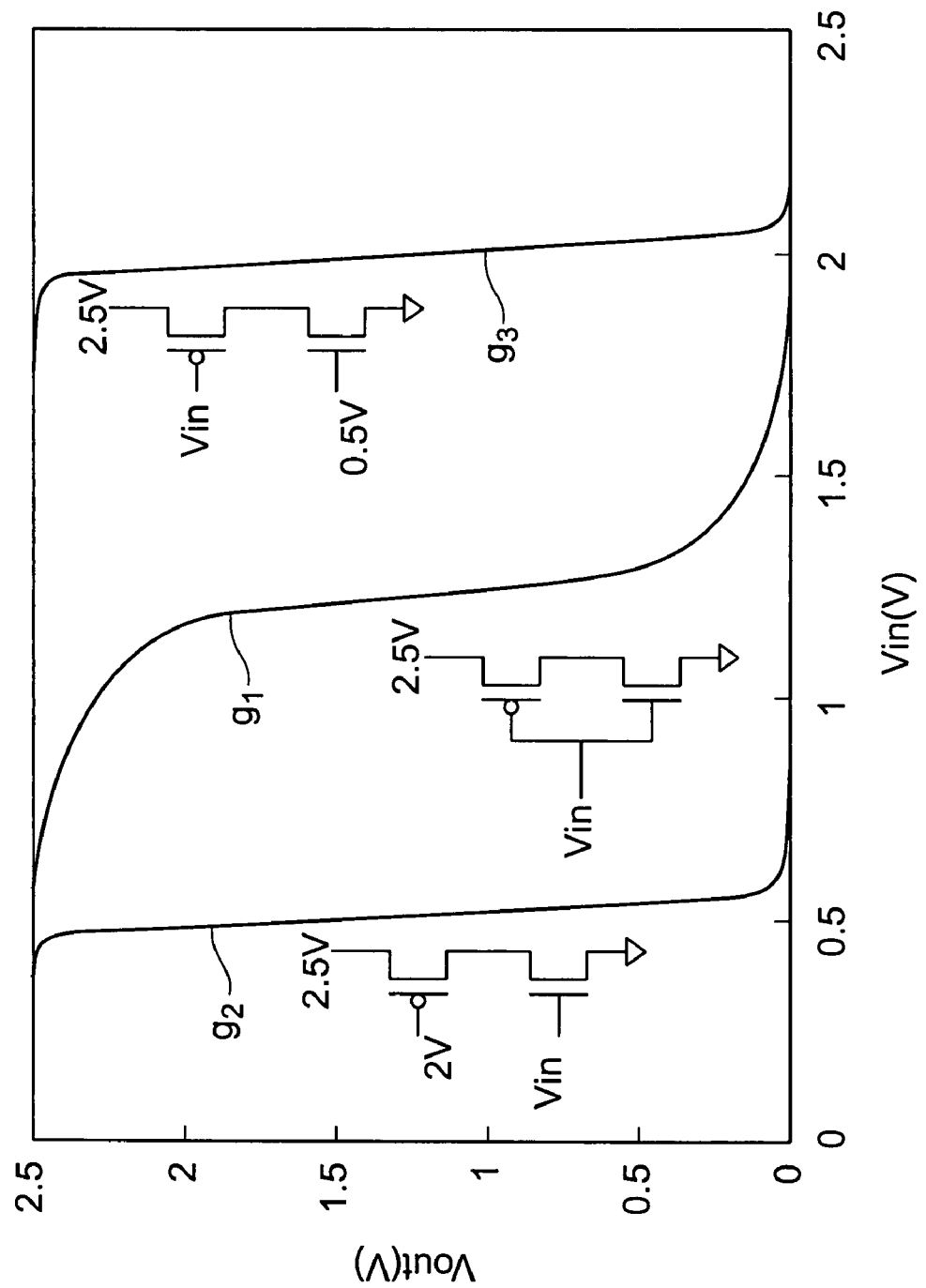
FIG. 8 is a graph showing simulation results of input-output voltage characteristics of a circuit changed in logical threshold.

A simulation result $g_1$ of input-output characteristics of an inverter in which gates of a PMOS transistor and an NMOS transistor are connected, a simulation result $g_2$ of input-output characteristics in the case where the gate voltage of a PMOS transistor is suitably adjusted, and a simulation result $g_3$ of input-output characteristics in the case where the gate voltage of an NMOS transistor is suitably adjusted are shown in FIG. 8. It is possible to actually change the threshold of the logical voltage. Furthermore, it is possible to obtain a buffer or a flip-flop changed in threshold of logical voltage by using this inverter as input. It is possible to change a logical threshold of an arbitrary logic gate by using a method of changing the above-described threshold voltage or load resistance.

Figure 9:
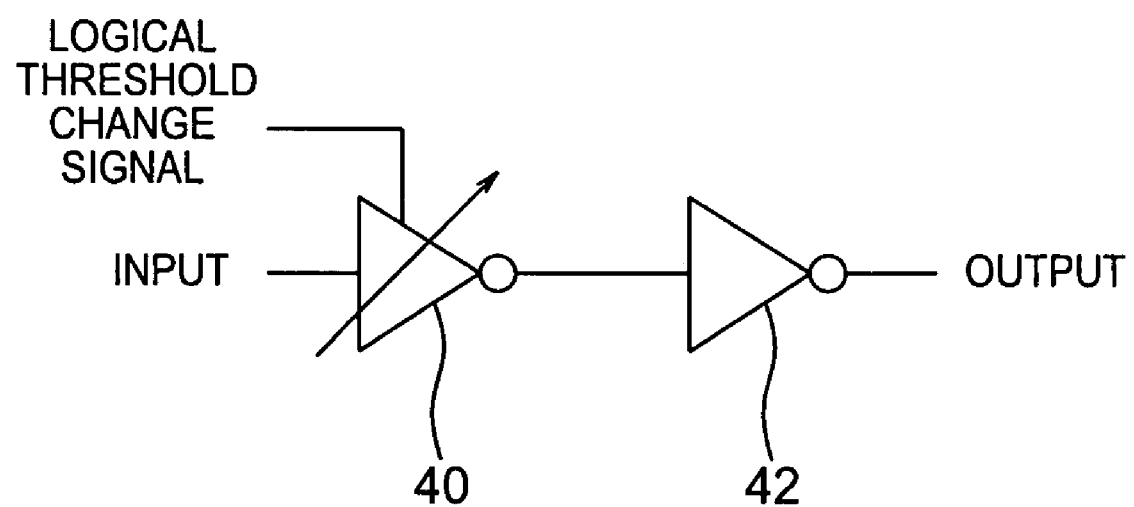
FIG. 9 is a circuit diagram showing a specific example of a buffer which makes a logical threshold variable.

A specific example of a buffer which makes the logical threshold variable is shown in FIG. 9. This buffer includes a logical inversion voltage variable inverter 40 which inverts the input on the basis of a logical threshold change signal, and an inverter 42 which inverts an output of the logical inversion voltage variable inverter 40. It becomes possible to construct a buffer by receiving the input at the logical inversion voltage variable inverter 40. In FIG. 9, a terminal for receiving the logical threshold change signal is provided supposing that the logical threshold is changed by using the substrate bias or the gate voltage. Alternatively, it is also possible to construct a buffer changed in logical threshold by using an inverter changed in logical inversion voltage by means of a technique of changing the amount of impurities and their distribution or the load resistance value.

Figure 10A:
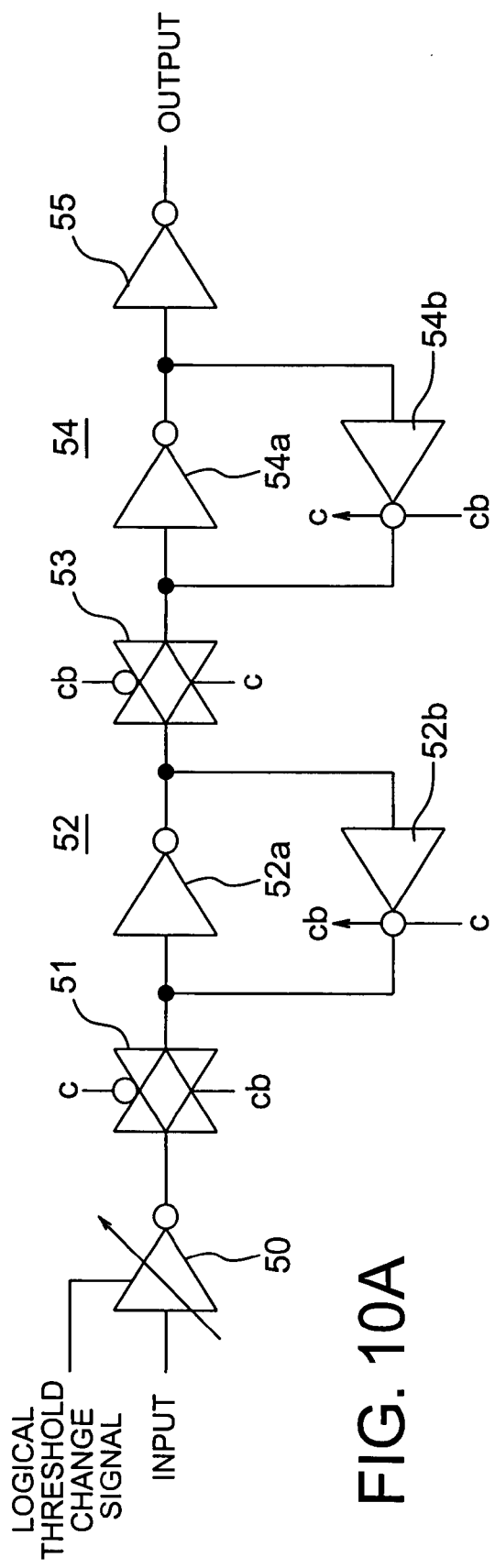
FIGS. 10A and 10B are circuit diagrams showing a specific example of a flip-flop circuit which makes a logical threshold variable.
Figure 10B:
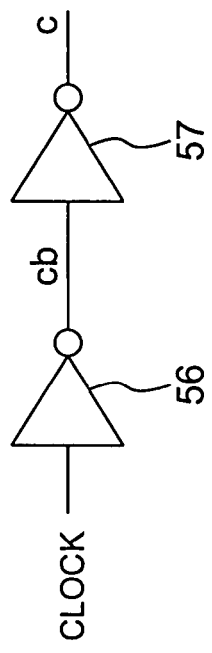

A specific example of a flip-flop which makes the logical threshold variable is shown in FIGS. 10A and 10B. The flip-flop includes a logical inversion voltage variable inverter 50, a transfer gate 51, a latch circuit 52 formed of an inverter 52a and a clocked inverter 52b, a transfer gate 53, a latch circuit 54 formed of an inverter 54a and a clocked inverter 54b, and an inverter 55. A clock signal c and its inverted signal cb input to the transfer gates 51 and 53 and the clocked inverters 52b and 54b are generated by an inverter 56 which receives an external clock signal and an inverter 57 which receives an output of the inverter 56 (FIG. 10B). It becomes possible to construct a flip-flop by receiving the input at the logical inversion voltage variable inverter 50. In FIGS. 10A and 10B, a terminal for receiving the logical threshold change signal is provided supposing that the logical threshold is changed by using the substrate bias or the gate voltage. Alternatively, it is also possible to construct a flip-flop changed in logical voltage threshold by using an inverter changed in logical inversion voltage by means of a technique of changing the amount of impurities and their distribution or the load resistance value.

The value to which the logical threshold should be changed is not determined unconditionally because it depends upon the logical threshold of the logical gate in standard use and values set as voltages of the "H" level and the "L" level in the system. As the changed logical threshold becomes closer to $V_{DD}$ or $V_{SS}$, however, it can be said that stricter inspection is conducted. Denoting a voltage set to the "H" level in the system by Vhigh and a voltage set to the "L" level by Vlow, it is desirable that a threshold Vga of the characteristic graph $g_a$ shown in FIG. 2 satisfies the equation hereinafter:

$$Vga < Vlow + \frac{Vhigh - Vlow}{3}$$

It is desirable that a threshold Vgc of the characteristic graph $g_c$ shown in FIG. 2 satisfies the equation hereinafter:

$$Vgc > Vhigh - \frac{Vhigh - Vlow}{3}$$

According to the present embodiment, it is possible to detect circuit degradation before an operation fault occurs as heretofore described.

SECOND EMBODIMENT

Figure 11:
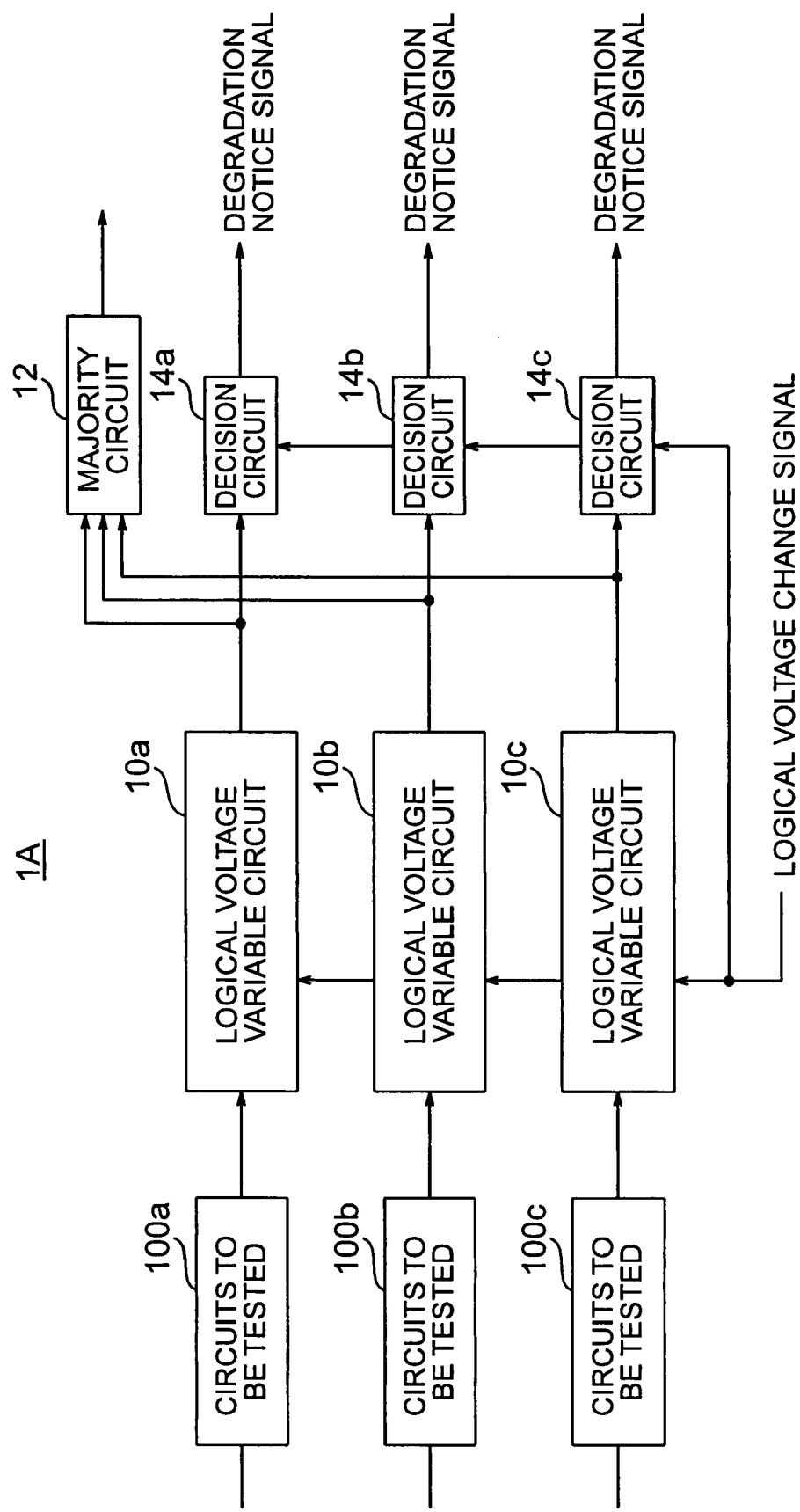
FIG. 11 is a block diagram showing a semiconductor integrated circuit according to a second embodiment of the present invention.

A semiconductor integrated circuit according to a second embodiment of the present invention is shown in FIG. 11. The semiconductor integrated circuit according to the present embodiment includes circuits 100a, 100b and 100c to be tested as to whether degradation is present, and a test circuit 1A which tests whether the circuits 100a, 100b and 100c have degraded. The test circuit 1A includes logical voltage variable circuits 10a, 10b and 10c which can dynamically change logical voltage thresholds of output voltage of the circuits 100a, 100b and 100c on the basis of a logical voltage change signal, a majority circuit 12, and decision circuits 14a, 14b and 14c.

In the present embodiment, detection of circuit device degradation is made possible besides bit error resistance against noise by combining the logical voltage variable circuits 10a, 10b and 10c which can be dynamically changed in logical voltage threshold with a redundant circuit obtained by connecting the circuits to be tested 100a, 100b and 100c having the same configuration in parallel. The logical voltage variable circuits 10a, 10b and 10c can be constructed by combining buffers or flip-flops (FFs).

In the present embodiment, the logical voltage threshold is dynamically changed to several kinds during one logic clock, and a decision is made whether there is a block inverted in logic. The logic itself decides the output of the logic block by using the majority circuit 12 and the decision circuits 14a, 14b and 14c.

Figure 12:
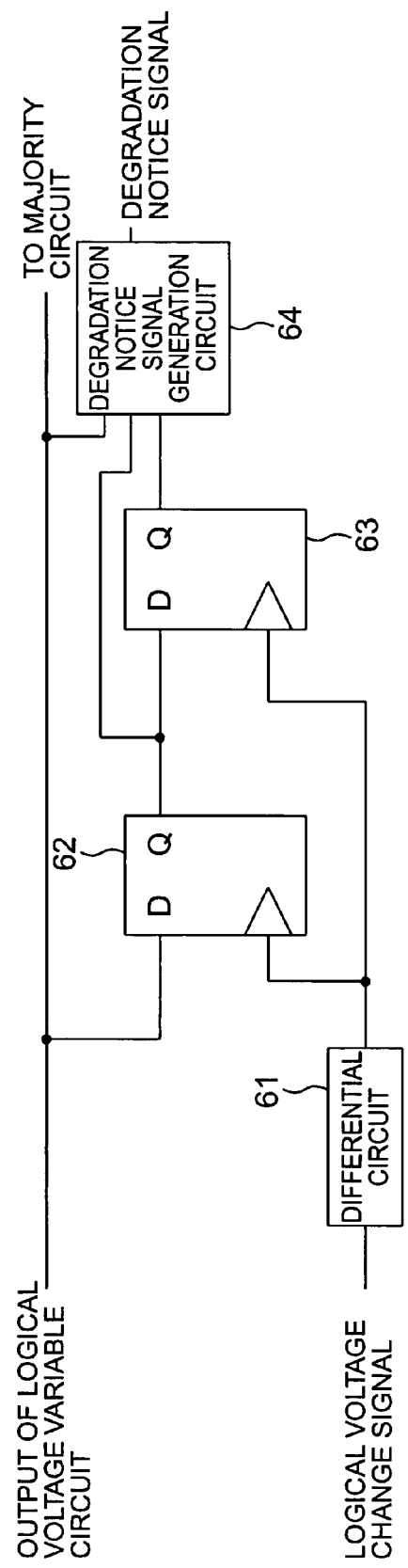
FIG. 12 is a circuit diagram showing a specific example of a decision circuit according to a second embodiment.
Figure 13A:
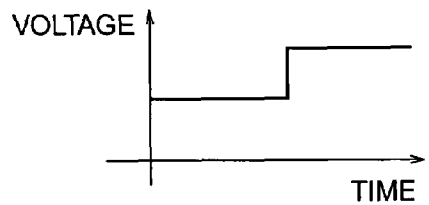
FIGS. 13A and 13B are graphs showing an input and an output of a differential circuit shown in FIG. 12.
Figure 13B:
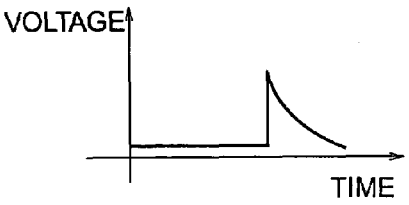

A specific example of the decision circuit according to the present embodiment is shown in FIG. 12. The decision circuits 14a, 14b and 14c are provided so as to be respectively associated with the logical voltage variable circuits 10a, 10b and 10c. As shown in FIG. 12, each of the decision circuits 14a, 14b and 14c includes a differential circuit 61, flip-flops 62 and 63, and a degradation notice signal generation circuit 64. A pulse signal indicating that the logical voltage threshold has been changed is output as shown in FIG. 13B by differentiating the corresponding logical voltage change signal with the differential circuit 61 as shown in FIG. 13A. This pulse signal is sent to the flip-flops 62 and 63 as a clock trigger. Upon receiving the pulse signal, the flip-flop 62 takes in the output of the corresponding logical voltage variable circuit. Upon receiving the pulse signal, the flip-flop 63 takes in an output of the flip-flop 62. If all of the output of the corresponding logical voltage variable circuit, the output of the flip-flop 62, and an output of the flip-flop 63 do not coincide, the degradation notice signal generation circuit 64 regards the corresponding tested circuit as degraded and generates a degradation notice signal. By the way, the degradation notice signal generation circuit 64 can be implemented with the circuit described with reference to the first embodiment and shown in FIG. 6. If the logical voltage change signal is raised or lowered monotonously, the degradation notice signal generation circuit 64 can be implemented with the circuit described with reference to the first embodiment and shown in FIG. 5.

Figure 14:
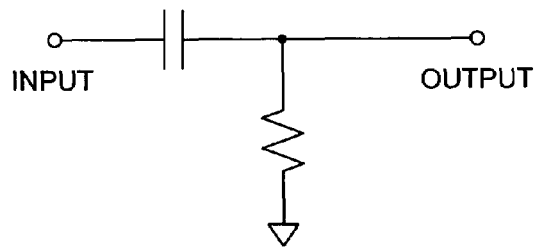
FIG. 14 is a circuit diagram showing a specific example of the differential circuit.
Figure 15:
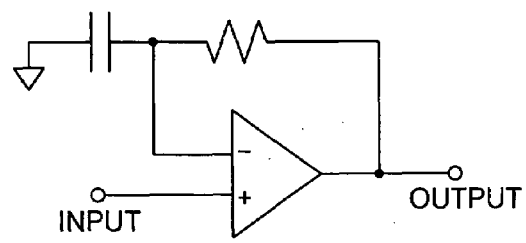
FIG. 15 is a circuit diagram showing another specific example of the differential circuit.
Figure 16A:
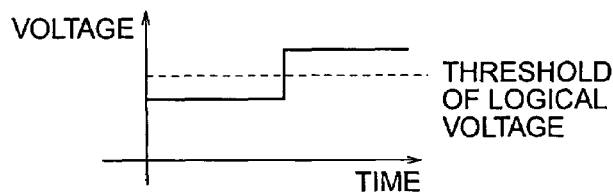
FIGS. 16A and 16B are graphs showing an input and an output obtained when detecting that a logical threshold has been changed.
Figure 16B:
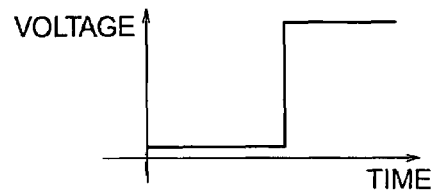

By the way, the differential circuit 61 can be implemented with a high pass filter. If the differential circuit is formed of, for example, only passive elements, the differential circuit may have a circuit configuration as shown in FIG. 14. If an operational amplifier is used to amplify the signal, a circuit configuration shown in FIG. 15 may be used. If the logical voltage change signal is changed gradually from a low level voltage to a high level voltage, the logical voltage change signal can be connected to the differential circuit as it is. If a change from a high voltage level to a low voltage level is included, a circuit which inverts the level of the logical voltage change signal or a circuit which changes the output of the differential circuit to a pulse in the positive direction is connected. When shaping the waveform, a logic circuit such as an inverter should be inserted. If each logical voltage change signal has a magnitude striding over a threshold of an inverter changed in logical inversion voltage as shown in FIG. 16A, a signal which indicates that the threshold of the logical voltage has been changed as shown in FIG. 16B can be generated by using inverters or buffers changed in resistance or impurity quantity and its distribution to have different logical voltage thresholds, instead of the differential circuits.

Figure 17:
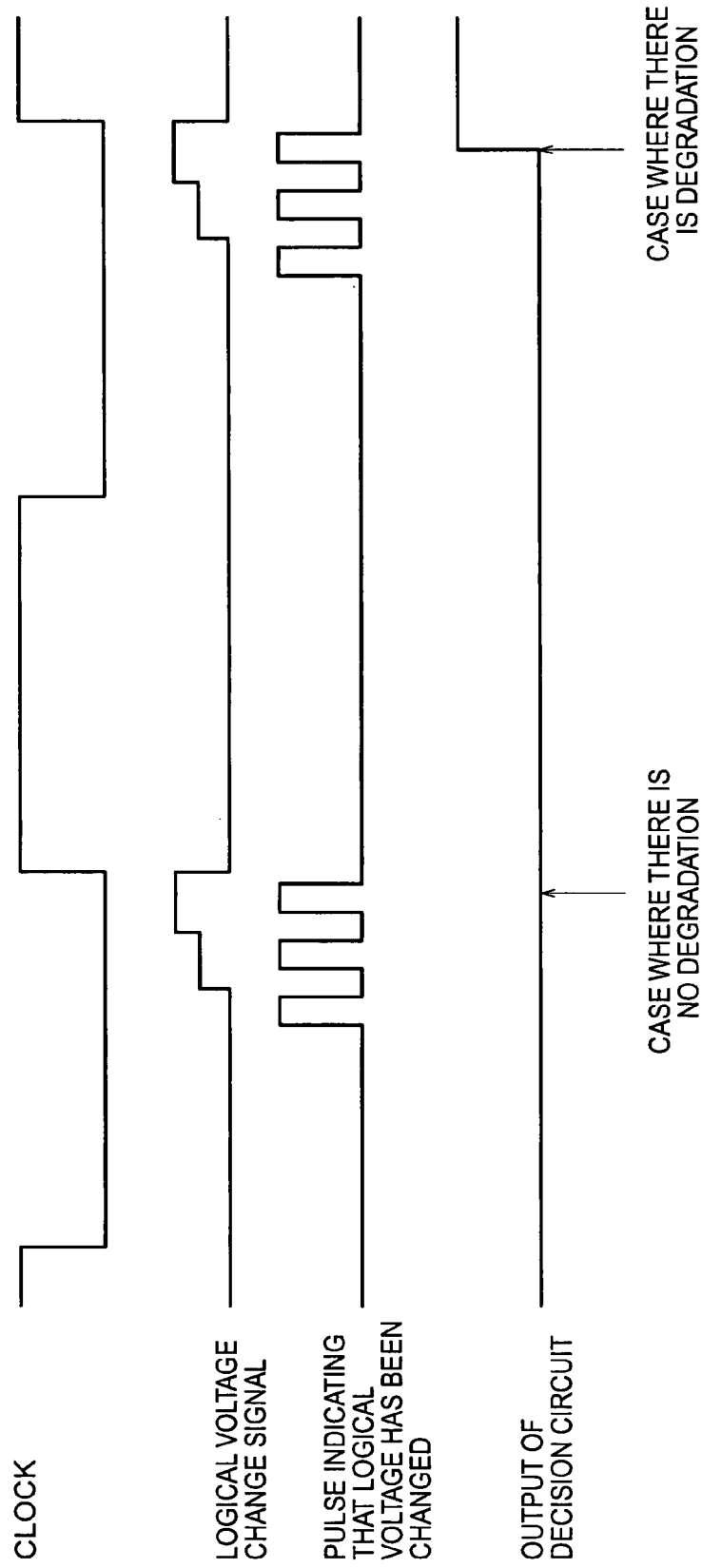
FIG. 17 is a waveform diagram for explaining an operation in a second embodiment.

Operation waveforms of the semiconductor integrated circuit according to the present embodiment are shown in FIG. 17. In the waveform diagram shown in FIG. 17, each circuit starts operation at a rising edge of the clock. If outputs of the tested circuits 100a, 100b and 100c stabilize soon after the rise of the clock, the voltage level is changed to change the level of the logical voltage change signal. If the voltage level is changed, each of the decision circuits 14a, 14b and 14c generates a pulse signal which gives a notice to that effect, and conducts a decision operation by using the pulse signal as a trigger. After the logical voltage change signal and the pulse signal have been supplied repetitively by a required number of times (three times in FIG. 17), the decision circuit outputs nothing if degradation is not present. If degradation has been detected, the decision circuit raises a degradation notice signal. FIG. 17 shows an example in which the degradation notice signal rises after the third pulse is output. As for the degradation notice, a degradation notice signal is output via an output buffer which is not illustrated after all logical voltage thresholds to be used for the test have been selected. Or only signal values after all logical voltage thresholds have been selected are adopted.

The majority circuit 12 has the same function as the majority circuit described with reference to the first embodiment does.

According to the present embodiment, it is possible to detect circuit degradation before an operation fault occurs as heretofore described.

THIRD EMBODIMENT

Figure 18:
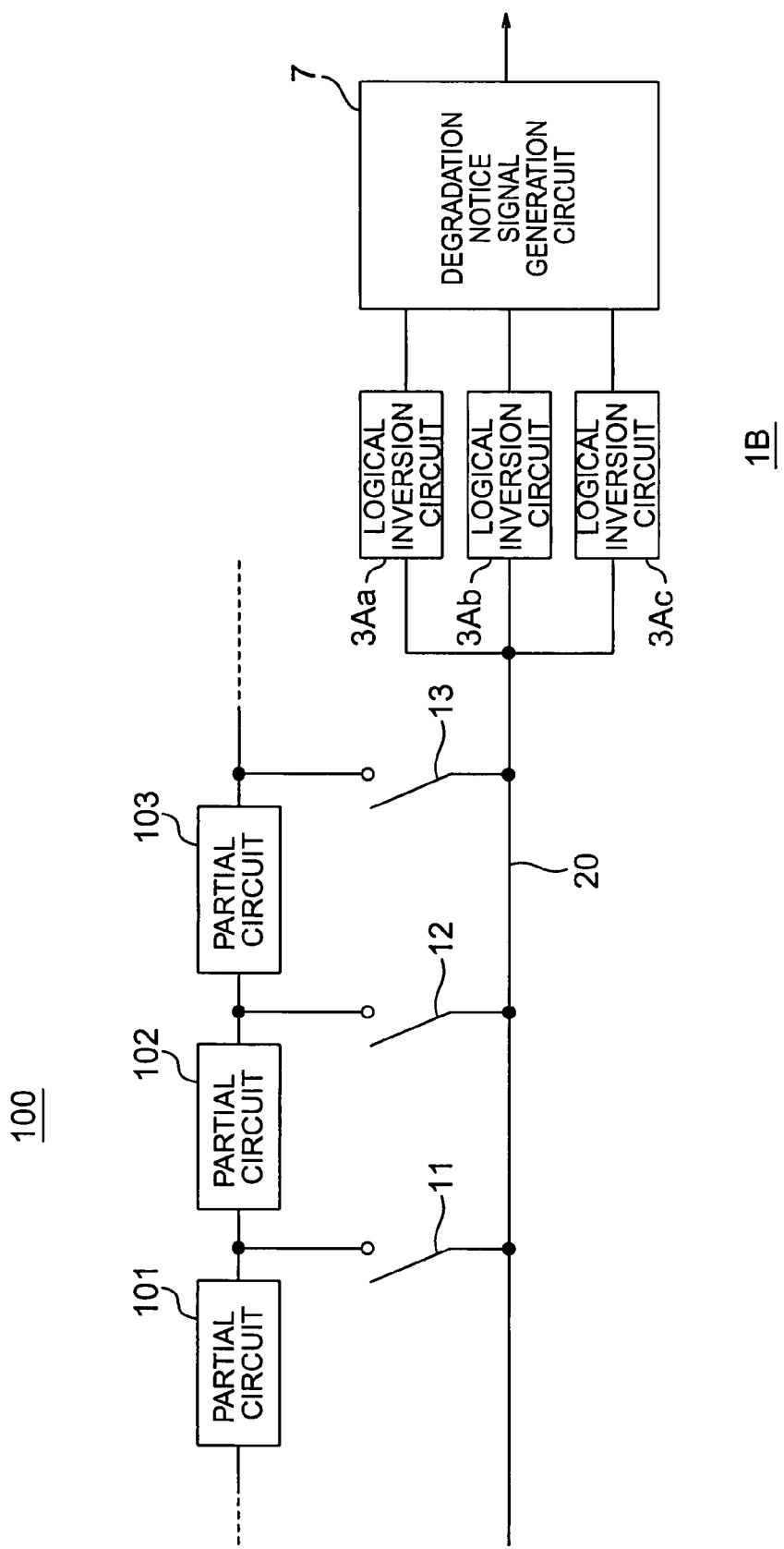
FIG. 18 is a circuit diagram showing a semiconductor integrated circuit according to a third embodiment of the present invention.

A semiconductor integrated circuit according to a third embodiment of the present invention is shown in FIG. 18. The semiconductor integrated circuit according to the present embodiment includes a circuit 100 to be tested, and a test circuit 1B. The circuit 100 includes finer partial circuits 101, 102 and 103.

The test circuit 1B includes logical inversion circuits 3Aa, 3Ab and 3Ac, a degradation notice signal generation circuit 7, and a test line 20. The logical inversion circuits 3Aa, 3Ab and 3Ac and the degradation notice signal generation circuit 7 have the same configurations as those of logical inversion circuits 3a, 3b and 3c and the degradation notice signal generation circuit 7 in the first embodiment, respectively. For example, an output of the partial circuit 101 is sent to the test line 20 via a switch 11. An output of the partial circuit 102 is sent to the test line 20 via a switch 12. An output of the partial circuit 103 is sent to the test line 20 via a switch 13. The logical inversion circuits 3Aa, 3Ab and 3Ac perform logical inversion on the basis of the signal sent via the test line 20. In the same way as the first embodiment, the logical inversion circuits 3Aa, 3Ab and 3Ac are different from each other in logical inversion threshold.

If a combination of different logical inversion voltages is added to all tested circuits, great redundancy is needed. Therefore, the present embodiment has a configuration in which several tested circuits can be evaluated collectively. Nodes of the tested circuit 100 are connected to the test line 20 via the switches 11 to 13, and the logical inversion circuits 3Aa, 3Ab and 3Ac are connected to the test line 20.

When testing a certain node, for example, the output end of the partial circuit 101, the switch 11 connected to the output end is turned on whereas other switches connected to the test line 20 are turned off and degradation of the partial circuit 101 is evaluated in the logical inversion circuits 3Aa, 3Ab and 3Ac. When testing a different node, for example, the output end of the partial circuit 102, the switch 11 in the on-state is turned off and the switch 12 connected to the node to be tested is turned on. The redundancy of the circuit can be mitigated by thus changing over the switches in order.

It is also possible to select some nodes and connect switches to the nodes without connecting switches to nodes of all partial circuits. In the same way, the unit of the partial circuit may be in the range of one logic gate to a circuit unit which is large to some extent. As for the combination of the test line and the logical inversion circuits as well, a plurality of combinations may be used instead of one combination.

According to the present embodiment, it is possible to detect circuit degradation before an operation fault occurs as heretofore described.

FOURTH EMBODIMENT

Figure 19:
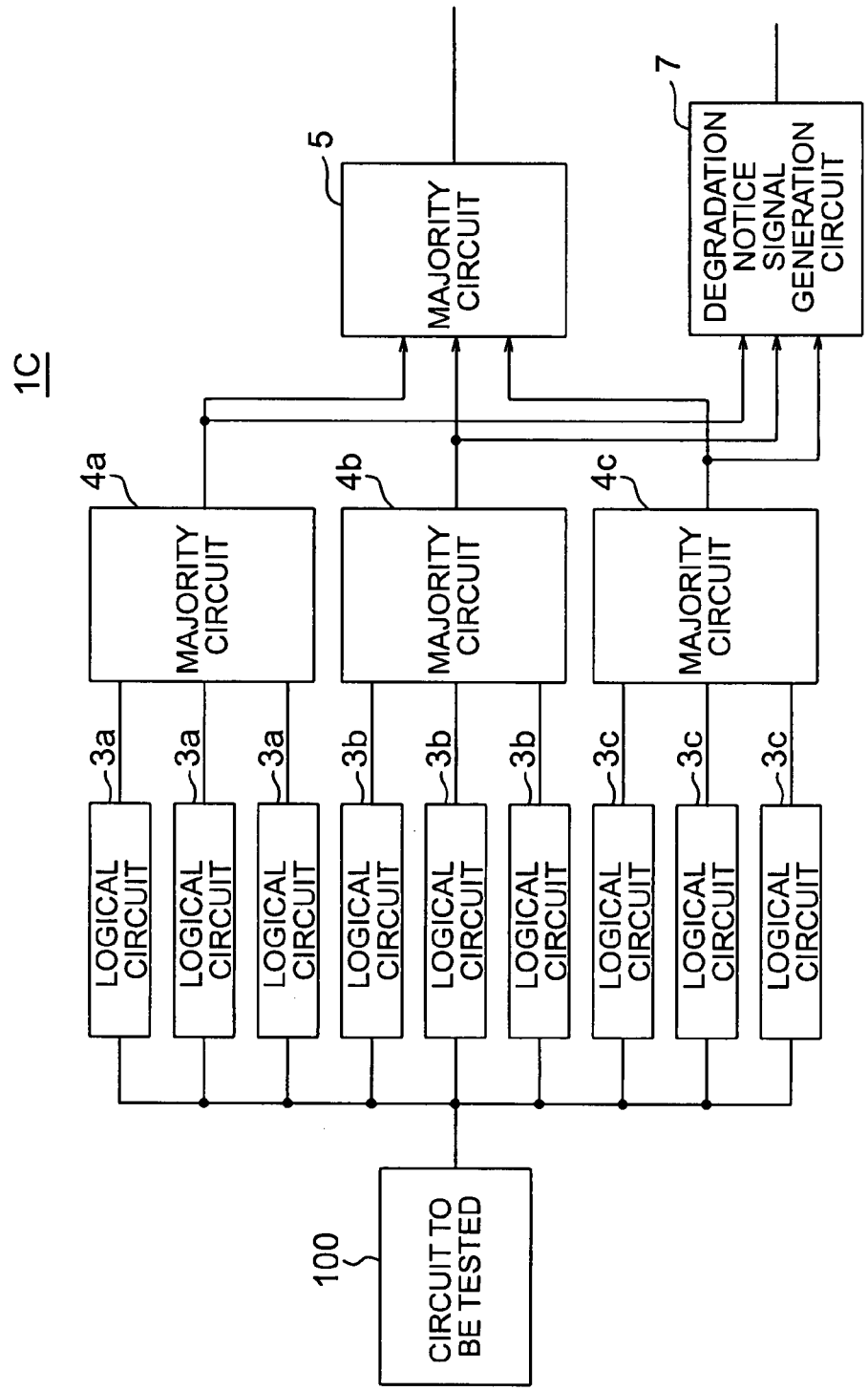
FIG. 19 is a circuit diagram showing a semiconductor integrated circuit according to a fourth embodiment of the present invention.

A semiconductor integrated circuit according to a fourth embodiment of the present invention is shown in FIG. 19. The semiconductor integrated circuit according to the present embodiment includes a circuit 100 to be tested and a test circuit 1C. The test circuit 1C has a configuration obtained by providing each of the logical circuits 3a, 3b and 3c in a plurality (three in FIG. 19) and newly providing majority circuits 4a, 4b and 4c in the test circuit 1 in the first embodiment shown in FIG. 1.

In the first embodiment shown in FIG. 1, there is a fear that the logical circuits 3a, 3b and 3c might degrade resulting in lowered detection reliability. For elements included in the logical circuits 3a, 3b and 3c in the first embodiment, therefore, highly reliable elements, such as elements belonging to an older generation of LSIs or large-sized elements, need to be used.

On the other hand, in the present embodiment, reliability falling is prevented by providing each of the logical circuits 3a, 3b and 3c in a plurality to give redundancy. In other words, a value which indicates a majority of outputs of the logical circuits 3a is output from the majority circuit 4a. A value which indicates a majority of outputs of the logical circuits 3b is output from the majority circuit 4b. A value which indicates a majority of outputs of the logical circuits 3c is output from the majority circuit 4c. The degradation notice signal generation circuit 7 generates a degradation notice signal on the basis of outputs of the majority circuits 4a, 4b and 4c. The majority circuit 5 selects a value which is the majority of the outputs of the majority circuits 4a, 4b and 4c, and sends the value to a subsequent circuit to be tested.

According to the present embodiment, it is possible to detect circuit degradation before an operation fault occurs as heretofore described.

According to the embodiments of the present invention, degradations in a circuit can be checked in the circuit and a circuit system having more excellent resistance against failures can be formed.

The embodiments have been described by taking CMOS logics as an example of the circuit to be tested. However, not only the CMOS logics but also other logic architectures can be used. For example, the embodiments can be used in NMOS logics in which logics are formed by using resistors instead of p-type MOS transistors, diode transistor logics, and crossbar architectures as well in the same way.

Figure 20:
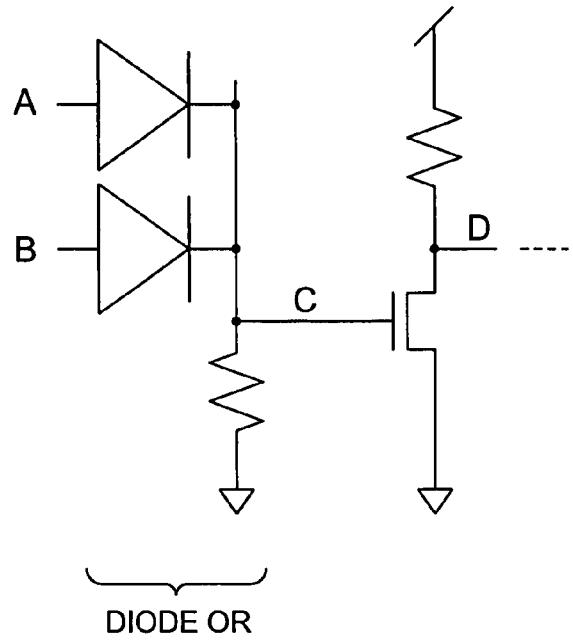
FIG. 20 is a circuit diagram showing a first specific example of a circuit to be tested.

In the diode transistor logics, OR circuits and AND circuits are implemented using diodes and they are combined with inverters. It is well known that all logics can be implemented if there are NOR gates or NAND gates. A circuit in FIG. 20 shows a combination of a two-input diode OR and an inverter. A circuit in FIG. 21 shows a combination of a two-input diode AND and an inverter.

If both inputs A and B of the diode OR are $V_{SS}$ in voltage, a node C becomes approximately $V_{SS}$ in voltage. If $V_{DD}$ is supplied to the input A, the input B or both of them, however, a voltage is applied across a resistor connected to the ground, and $V_{DD}$ appears at the node C. In FIG. 20, the node C is connected to a gate of the inverter formed of a resistor and an NMOS transistor. A voltage obtained by inverting the voltage at the node C in polarity is output to the node D. The inverter part may be formed of, as a matter of course, a resistor and a PMOS transistor, or may be a CMOS type. Or the inverter part may have a dynamic circuit configuration such as a precharge logic.

Figure 21:
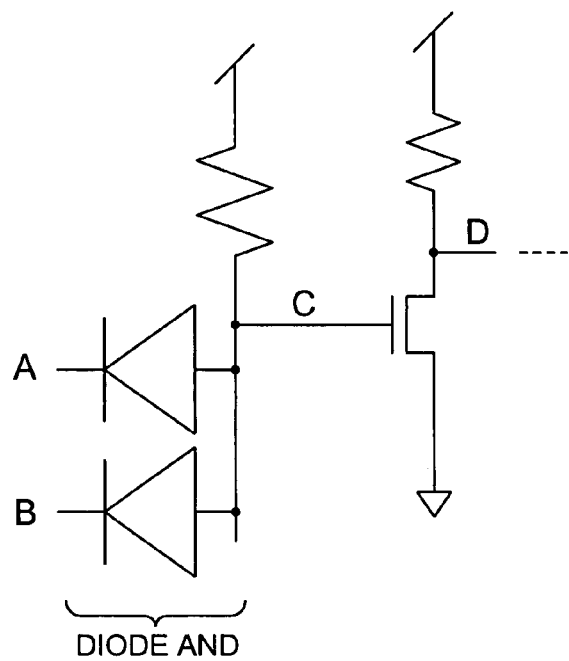
FIG. 21 is a circuit diagram showing a second specific example of a circuit to be tested.

If $V_{DD}$ is applied to both inputs A and B in the diode AND shown in FIG. 21, a node C is kept at $V_{DD}$. If $V_{SS}$ is applied to the input A, B or both of them, however, a current flows through the diode and the node C assumes a voltage close to $V_{SS}$. In FIG. 21, the node C is connected to a gate of the inverter formed of a resistor and an NMOS transistor. A voltage obtained by inverting the voltage at the node C in polarity is output to the node D. The inverter part may be formed of, as a matter of course, a resistor and a PMOS transistor, or may be a CMOS type. Or the inverter part may have a dynamic circuit configuration such as a precharge logic.

Figure 22:
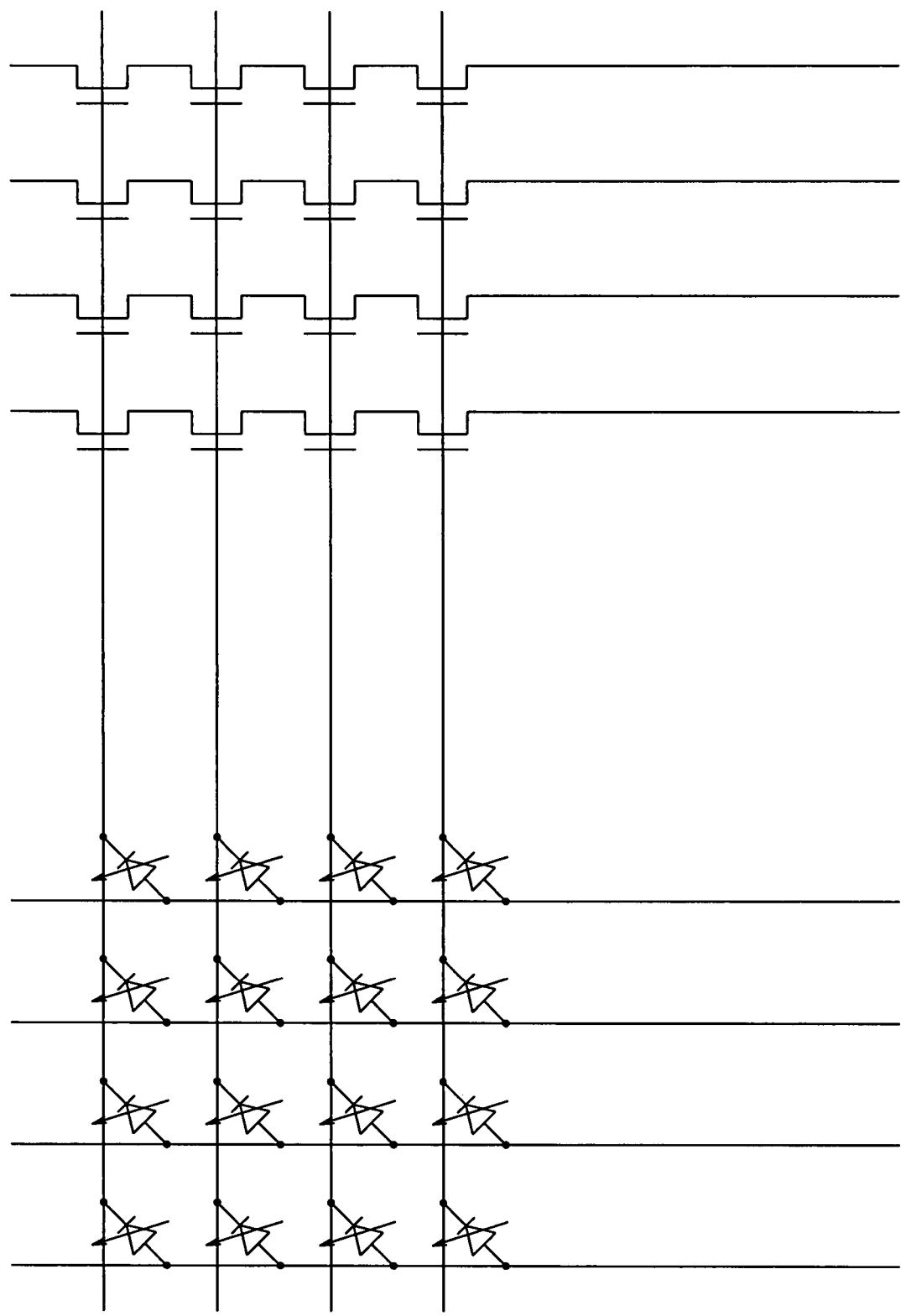
FIG. 22 is a circuit diagram showing a third specific example of a circuit to be tested.

If diodes and transistors are arranged as shown in FIG. 22 and wires are connected in a crossed form, a crossbar type configuration can be formed. At this time, it is not necessary to connect all wires to diodes and transistors. A desired logic can be obtained by connecting and disconnecting necessary crosspoint parts according to a logic to be generated. An architecture for implementing a desired logic as a reconfigurable logic by using a resistance change element capable of programming a resistance value, such as a phase change material, an ion conduction material, a molecule material to form a programmable diode has been proposed (A. DeHon, IEEE TRANSACTIONS ON NANOTECHNOLOGY, VOL. 2, NO. 1, P. 23, MARCH 2003).

Figure 23:
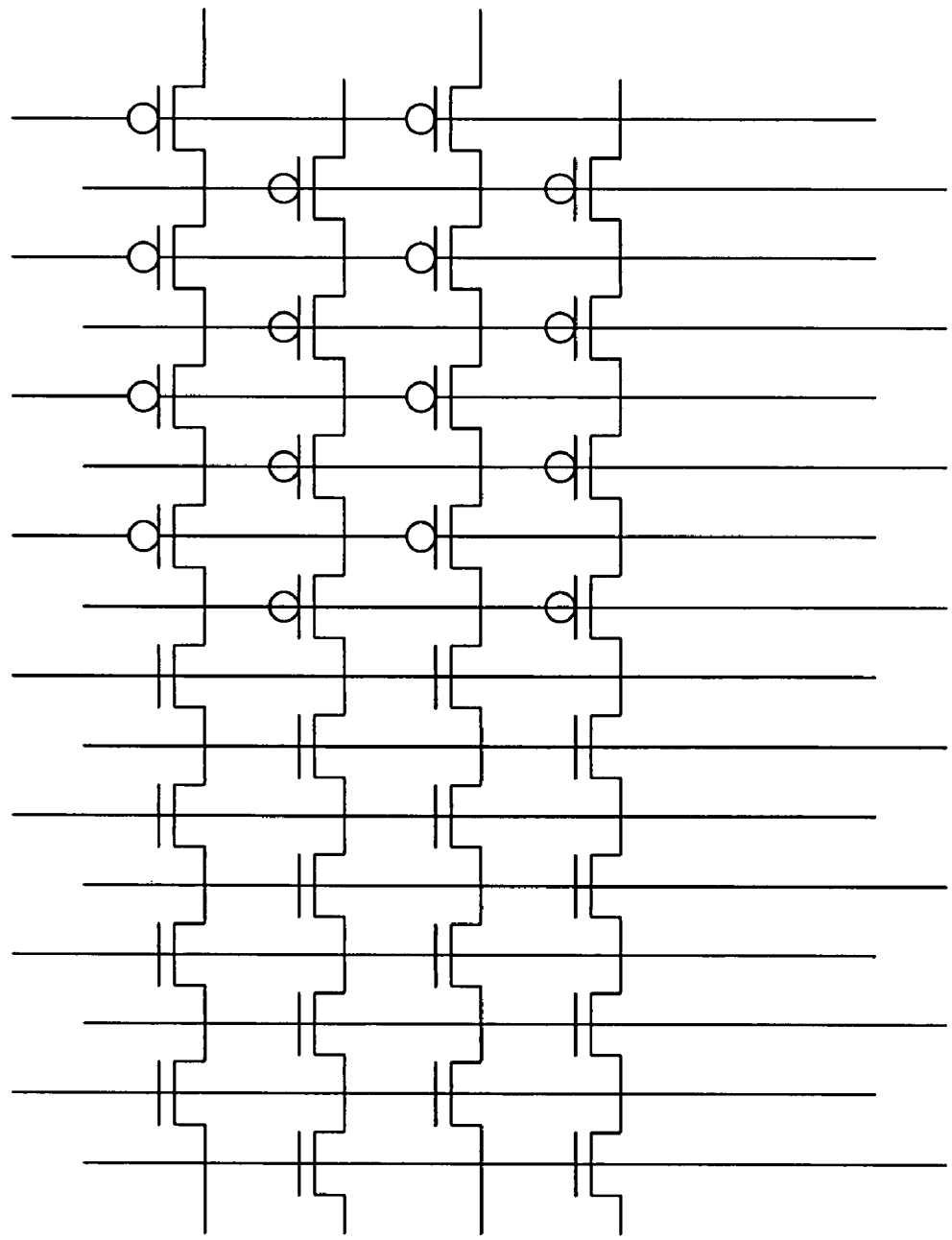
FIG. 23 is a circuit diagram showing a fourth specific example of a circuit to be tested.

Furthermore, the crossbar-type wiring can also be implemented by arranging nano-wire transistors as shown in FIG. 23 without using diodes. In the same way as the case shown in FIG. 22, a necessary logic is obtained by connecting and disconnecting crosspoint parts according to a desired logic or using resistance change elements to form a reconfigurable logic.

Especially in a programmable logic architecture utilizing programming of resistance change elements, circuit reconfiguration must be conducted periodically because the program retention time of resistance change elements is finite. However, the retention time of the resistance value varies according to elements, and it is difficult to previously know suitable timing of reconfiguration. As a matter of fact, reconfiguration is previously conducted allowing a margin to some degree. However, this work is not necessary originally for conducting reconfiguration on the circuit before occurrence of a failure. According to the present invention, a temporal change of a resistance change can be detected. Therefore, circuit reconfiguration can be conducted without waste. The cost required for the reconfiguration can be lowered.

As a result, the circuit life can be known, and timing of circuit replacement or circuit reconfiguration can be known.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor integrated circuit comprising:
   a circuit to be tested;
   a plurality of logical circuits which have different logical thresholds and which perform operation on an output of the circuit to be tested, on the basis of the logical thresholds; and
   a degradation notice signal generation circuit which generates a degradation notice signal to give notice that the circuit to be tested has degraded, when outputs of the logical circuits do not coincide with each other.

2. The semiconductor integrated circuit according to claim 1, wherein the logical circuits have different logical thresholds, and the logical circuits invert the output of the circuit to be tested, on the basis of the logical thresholds.

3. The semiconductor integrated circuit according to claim 2, wherein each of the logical circuits is an inverter.

4. The semiconductor integrated circuit according to claim 3, wherein the logical threshold of each of the logical circuits is adjusted by using a doping quantity of impurities in a channel or around the channel in a transistor of the inverter.

5. The semiconductor integrated circuit according to claim 3, wherein the logical threshold of each of the logical circuits is adjusted by using a substrate bias applied to a transistor in the inverter.

6. The semiconductor integrated circuit according to claim 3, wherein the logical threshold of each of the logical circuits is adjusted by using a load resistance of the inverter.

7. The semiconductor integrated circuit according to claim 3, wherein the logical threshold of each of the logical circuits is adjusted by using a gate voltage of a transistor for load resistance in the inverter.

8. The semiconductor integrated circuit according to claim 1, wherein each of the logical circuits is a buffer circuit comprising an inverter.

9. The semiconductor integrated circuit according to claim 1, wherein each of the logical circuits is a flip-flop circuit comprising an inverter.

10. A semiconductor integrated circuit comprising:
    a plurality of circuits to be tested which are same in configuration;
    a plurality of logical voltage variable circuits which are provided so as to be respectively associated with the circuits to be tested, each of which has a variable logical voltage threshold and performs operation on an output of the associated circuit to be tested, on the basis of the logical voltage threshold; and
    a plurality of degradation notice signal generation circuits which are provided so as to be respectively associated with the logical voltage variable circuits, and each of which generates a degradation notice signal to give notice that the associated circuit to be tested has degraded, provided that the output of the associated logical voltage variable circuit differs when the logical voltage threshold of the associated logical voltage variable circuit is changed.

11. The semiconductor integrated circuit according to claim 10, wherein each of the logical voltage variable circuits has a variable logical voltage threshold and inverts an output of the associated circuit to be tested, on the basis of the logical voltage threshold.

12. The semiconductor integrated circuit according to claim 11, wherein each of the logical voltage variable circuits is an inverter.

13. The semiconductor integrated circuit according to claim 12, wherein the logical voltage threshold of each of the logical voltage variable circuits is adjusted by using a substrate bias applied to a transistor in the inverter.

14. The semiconductor integrated circuit according to claim 12, wherein the logical voltage threshold of each of the logical voltage variable circuits is adjusted by using a gate voltage of a transistor for load resistance in the inverter.

15. The semiconductor integrated circuit according to claim 10, wherein each of the logical voltage variable circuits is a buffer circuit comprising an inverter.

16. The semiconductor integrated circuit according to claim 10, wherein each of the logical voltage variable circuits is a flip-flop circuit comprising an inverter.

17. A semiconductor integrated circuit comprising:
    a circuit to be tested having first and second partial circuits;
    a test line;
    a first switch provided between an output of the first partial circuit and the test line;
    a second switch provided between an output of the second partial circuit and the test line;
    a plurality of logical inversion circuits which are connected to the test line, which have different logical inversion thresholds, and each of which inverts an output of at least one of the first and second partial circuits sent via the test line according to states of the first and second switches, on the basis of the logical inversion threshold; and
    a degradation notice signal generation circuit which generates a degradation notice signal to give notice that the circuit to be tested has degraded, when outputs of the logical inversion circuits do not coincide.

18. The semiconductor integrated circuit according to claim 17, wherein each of the logical inversion circuits is an inverter.

19. The semiconductor integrated circuit according to claim 18, wherein the logical inversion threshold of each of the logical inversion circuits is adjusted by using a substrate bias applied to a transistor in the inverter.

20. The semiconductor integrated circuit according to claim 18, wherein the logical inversion threshold of each of the logical inversion circuits is adjusted by using a gate voltage of a transistor for load resistance in the inverter.

* * * * *